United States Patent [19]

Yin

[11] Patent Number: 4,465,945
[45] Date of Patent: Aug. 14, 1984

[54] TRI-STATE CMOS DRIVER HAVING REDUCED GATE DELAY

[75] Inventor: Patrick Yin, San Jose, Calif.

[73] Assignee: LSI Logic Corporation, Milpitas, Calif.

[21] Appl. No.: 414,743

[22] Filed: Sep. 3, 1982

[51] Int. Cl.³ ............... H03K 19/017; H03K 19/094; H03K 19/20
[52] U.S. Cl. .................................. 307/473; 307/270; 307/451
[58] Field of Search ............... 307/473, 474, 451, 469, 307/270; 364/716

[56] References Cited

U.S. PATENT DOCUMENTS

| | | | |
|---|---|---|---|
| 3,896,430 | 7/1975 | Hatsukano | 307/473 |
| 3,928,773 | 12/1975 | Oguey et al. | 307/451 |
| 4,037,114 | 7/1977 | Stewart et al. | 307/473 |
| 4,121,203 | 10/1978 | Edwards et al. | 307/473 |
| 4,345,172 | 8/1982 | Kobayashi et al. | 307/473 |

FOREIGN PATENT DOCUMENTS 55-5686  8/1981  Japan .................................. 307/473

OTHER PUBLICATIONS

Kraft et al., "Tristate Driver Utilizing Bipolar-Complementary Metal-Oxide Semiconductor Technology", IBM Tech. Disc. Bull., vol. 16, No. 8,1-'74, pp. 2677-2678.

Primary Examiner—Larry N. Anagnos
Assistant Examiner—David R. Hudspeth
Attorney, Agent, or Firm—Alan H. MacPherson; Steven F. Caserza; Richard Franklin

[57] ABSTRACT

A Tri-State circuit element is constructed which is uniquely suited for use in large scale integrated circuit devices wherein a relatively large number of such Tri-State circuits are utilized to drive other circuitry contained within the integrated circuit device. One embodiment of a Tri-State circuit is constructed utilizing a single NAND gate (73), a single inverter (74), a single P channel transistor (76), and two N channel transistors (77, 78) yielding a circuit having a propagation delay of only two gate delays and requiring a total of only nine transistors. Another embodiment of this invention is a Tri-State circuit constructed utilizing a single NOR gate (84), a single inverter (83), a single N channel transistor (88), and two P channel transistors (86, 87). In this embodiment of my invention, a total of nine MOS transistors are required, and the propagation delay between the input terminal and the output terminal is equal to two gate delays.

12 Claims, 12 Drawing Figures

TRI-STATE CMOS DRIVER HAVING REDUCED GATE DELAY

BACKGROUND OF THE INVENTION

1. Field of the Invention

This invention relates to electronic circuits, and more particularly to a Tri-State output circuit which is particularly useful in integrated circuit devices.

2. Description of the Prior Art

Tri-State circuit elements are well-known in the prior art. The symbol for an active low Tri-State buffer is shown in FIG. 1a. Simalarly, the circuit diagram for an active high Tri-State buffer is shown in FIG. 1b. Referring to FIG. 1a, active low Tri-State buffer 10 receives a low enable input signal E on input lead 12, and a data input signal A on input lead 11. In response to the data and enable input signals A and E, buffer 10 provides an output signal Z on output lead 13. When the active low Tri-State buffer 10 is disabled by the application of a high enable signal E (i.e. logical 1, typically 5 volts), the output lead 13 is in the high impedance state, and is effectively disconnected from either ground or the positive voltage supply VCC connected to buffer 10. Conversely, when buffer 10 is enabled by a low enable signal E (i.e. a logical 0, typically 0 volts), the output signal Z on lead 13 is determined by the data input signal A applied to lead 11. Thus, with buffer 10 enabled, and a logical 0 data input signal A applied to buffer 10, buffer 10 will provide a logical 0 (i.e. ground) output signal Z. Conversely, with buffer 10 enabled and a logical 1 input signal A applied to buffer 10, buffer 10 will provide a logical 1 (i.e. VCC) output signal Z.

The active high Tri-State buffer 100 of FIG. 1b, operates in a similar fashion as the active low Tri-State buffer 10 of FIG. 1a with the exception that active high Tri-State buffer 100 is enabled by a high enable signal E, and disabled by a low enable signal E.

One prior art implementation of the active low Tri-State buffer 10 of FIG. 1a is shown in the schematic diagram of FIG. 2. As shown in FIG. 2, buffer 20 includes input terminal 21 for receiving the enable signal E. When Tri-State buffer 20 is disabled by the application of a logical one enable signal E, the logical one enable signal E is applied to one input lead of NOR gate 25a thereby causing NOR gate 25a to generate a logical zero signal on its output lead which is connected to the input lead of inverter 27a. Inverter 27a thus generates on its output lead a logical one output signal which is applied to the gate of P channel MOS transistor 28a, thus causing MOS transistor 28a to turn off. Simultaneously, the logical one enable signal E is applied to the input lead of inverter 24, thus causing inverter 24 to generate a logical zero signal on its output lead which in turn is applied to one input lead of NAND gate 25b. NAND gate 25b thus generates a logical one signal on its output lead which in turn is applied to the input lead of inverter 27b. Inverter 27b thus generates a logical zero signal on its output lead which is applied to the gate of N channel MOS transistor 28b, thus causing transistor 28b to turn off. With transistors 28a and 28b both turned off, output terminal 26 of Tri-State buffer 20 is effectively disconnected from both ground (connected to the source lead of MOS transistor 28b), and the positive supply voltage VCC (connected to terminal 29, which in turn is connected to the source terminal of MOS transistor 28a). Thus, with a logical one enable signal E applied to active low Tri-State buffer 20, output terminal 26 is essesentially "floating", and current is not sourced to or sinked from external circuitry (not shown) connected to terminal 26. This, Tri-State buffer 20 is effectively disabled.

Conversely, with a logical zero enable signal E applied to input terminal 21 of Tri-State buffer 20, buffer 20 is enabled and the output signal on lead 26 is determined by the data input signal A applied to input terminal 22. For example, with buffer 20 enabled by a logical zero enable signal E, and a logical zero input data signal A applied to terminal 22, inverter 23 provides a logical one signal on its output lead 23a, thus causing NOR gate 25a to provide a logical zero signal on its output lead. The logical zero output signal from NOR gate 25a is in turn applied to the input lead of inverter 27a. Inverter 27a thus provides a logical one output signal to the gate of MOS transistor 28a, thus causing transistor 28a to turn off. Simultaneously, the logical zero enable signal E is applied to the input lead of inverter 24, thus causing inverter 24 to provide a logical one signal on its output lead 24a which in turn is applied to one input lead of NAND gate 25b. The logical one signal on lead 23a is applied to the other input lead of NAND gate 25b, thus causing NAND gate 25b to generate a logical zero on its output lead. This logical zero output signal from NAND gate 25b is in turn applied to the input lead of inverter 27b, and inverter 27b thus generates a logical one signal on its output lead. This logical one signal on the output lead of inverter 27b is applied to the gate of N channel MOS transistor 28b, thus causing transistor 28b to turn on. Thus, with buffer 20 enabled by a logical zero enable signal E, and a logical zero data signal A applied to terminal 22, MOS transistor 28a is turned off and MOS transistor 28b is turned on, thus effectively connecting output terminal 26 to ground through MOS transistor 28b and disconnecting output terminal 26 from the positive supply voltage VCC connected to terminal 29, thus providing a logical zero output signal Z and allowing Tri-State buffer 20 to sink current from external circuitry (not shown) connected to terminal 26.

Conversely, with Tri-state inverter 20 enabled by a low enable signal E and with a logical one data signal A applied to terminal 22, inverter 23 provides a logical zero signal on its output lead 23a, and NOR gate 25a provides a logical one signal on its output lead, inverter 27a provides a logical zero signal on its output lead connected to the gate of P channel transistor 28a, thus causing transistor 28a to turn on. Simultaneously NAND gate 25b provides a logical one on its output lead, and inverter 27b provides a logical zero on its output lead connected to the gate of transistor 28b, thus causing transistor 28b to turn off. Thus, with buffer 20 enabled by a logical zero enable signal E, and a logical one data signal A applied to terminal 22, output terminal 26 is effectively connected to the positive supply voltage VCC and is disconnected from ground, thus allowing Tri-State buffer 20 to source current to external circuitry (not shown) connected to terminal 26.

The truth table depicting the operation of active low Tri-State buffer 10 of FIG. 1 is as follows:

| E | A | Z |
|---|---|---|
| 0 | 0 | 0 |
| 0 | 1 | 1 |
| 1 | 1 | High impedance |
| 1 | 0 | High impedance |

The Tri-State circuit 20 of FIG. 2 requires, in its simplest implementation, a total of twelve transistors. For example, an inverter, such as any one of inverters 23, 24, 27a, and 27b, is comprised of two MOS transistors, as shown in FIGS. 4a and 4b. FIG. 4a shows the symbol for an inverter 40 having an input terminal 41 and an output terminal 42. FIG. 4b shows the MOS transistor implementation of the inverter 40. As shown on FIG. 4b, inverter 40, again having input terminal 41 and output terminal 42, is constructed by suitably connecting P channel MOS transistor 44 and N channel MOS transistor 45, with terminal 43 being connected to a positive voltage supply. Thus, inverter 40 requires two MOS transistors. Similarly, a NAND gate, such as NAND gate 25b of FIG. 2, requires four MOS transistors. As shown in FIG. 5a and FIG. 5b, NAND gate 50, having input leads 51 and 52 and output lead 53, is contructed utilizing P channel MOS transistors 54 and 55, and N channel MOS transistors 56 and 57, with terminal 58 being connected to a positive voltage supply. Futhermore, a NOR gate, such as NOR gate 25a of FIG. 2, requires four MOS transistors. As shown in FIGS. 6a and 6b, NOR gate 60 having input terminals 61 and 62 and output terminal 63, is constructed utilizing P channel MOS transistors 65 and 66, and N channel MOS transistors 67 and 68. Thus, the Tri-State inverter circuit 20 of FIG. 2 requires a total of 14 MOS transistors.

Furthermore, when the Tri-State buffer 20 of FIG. 2 is enabled, the transition time between the application of an input signal A to input terminal 22 and the receipt of its corresponding output signal Z on output terminal 26 is equal to four gate delays. In other words, the operation of P channel MOS transistor 28a in response to an input signal A occurs after the input data signal A is propagated through gates 23, 25a, 27a, and transistor 28a, a total of four gate delays. Similarly, the operation of N channel MOS transistor 28b in response to input data signal A is also four gate delays, the gate delays provided by gates 23, 25b, 27b, and transistor 28b.

Using output transistors 28a and 28b of suitable geometries, Tri-State inverter 20 of FIG. 2 is capable of sinking or sourcing a rather large amount of current (typically 3.2 milliamperes) from output terminal 26. This relatively high output driving current ability is useful for driving external circuitry (not shown) connected to terminal 26, and the Tri-State inverter 20 of FIG. 2 is thus useful as an output buffer between the internal components of an integrated circuit device and external circuitry.

Of importance, the resistivity of a semiconductor sample, including the resistivity of the current carrying channel of an MOS transistor, is inversely proportional to the mobility of the charge carriers within the channel. Thus, as described, for example, in a text by A. S. Grove entitled "Physics and Technology of Semiconductor Devices", John Wiley and Sons, Inc., 1967, pages 111-113, the resistivity of a P type semiconductor sample $$\rho_P = 1/q\mu_P P$$

where
$\rho_P$ = the resistivity of the P type semiconductor, in ohm-cm;
q = the magnitude of charge of a hole, which is equal to the charge of an electron;
$\mu_P$ = the mobility of a hole; and
P = the P type impurity concentration.
Similarly, the resistivity of an N type semiconductor sample is $$\rho_N = 1/q\mu_N N$$

where
$\rho_N$ = the resistivity of the N type semiconductor, in ohm-cm;
$\mu_N$ = the mobility of an electron; and
N = the N type impurity concentration.
Thus, for a given impurity concentration of both P type and N type impurities $$\rho_P/\rho_N = \mu_N/\mu_P$$

As described in the aforementioned text of Grove, the mobilities of electrons and holes are dependent on temperature and impurity concentration, and the mobility of electrons is typically about twice the mobility of holes, for a given temperature and impurity concentration.

The resistance of a sample of semiconductor material is defined as $$R = \rho L/A$$

where
R = the resistance of the sample;
$\rho$ = the resistivity of the sample;
L = the length of the sample; and
A = the cross-sectional area of the sample.

Thus, for a given impurity concentration and temperature, in order to provide an N channel MOS transistor and a P channel MOS transistor having equal channel resistances, and thus equal current carrying abilities for a given set of gate, source, drain and substrate voltages, the cross-sectional area of the P channel transistor must be approximately twice the cross-sectional area of the N channel transistor.

One prior art active high Tri-State circuit is shown in the schematic diagram of FIG. 3. With a logical zero enable signal E applied to one input lead of NAND gate 31, the output signal from NAND gate 31 is a logical one, thus turning off P channel MOS transistor 36. Similarly, with a logical zero enable signal E applied to the input lead of inverter 34, inverter 34 provides a logical one signal on its output lead, which is connected to one input lead of NOR gate 32, thus causing NOR gate 32 to provide a logical zero signal on its output lead. This logical zero output signal from NOR gate 32 is applied to the gate of N channel MOS transistor 39, thus causing transistor 39 to turn off. With both transistors 36 and 39 turned off in response to a logical zero enable signal E, the Tri-State inverter 30 is disabled, and output terminal 38 is in the high impedance state.

Active high Tri-State 30 is enabled by a logical one enable signal E. With a logical one enable signal E and a logical zero data signal A applied to Tri-State buffer 30, the output signal from NAND gate 31 is a logical one, thus causing P channel transistor 36 to turn off. Simarlily, with a logical one enable signal E and a logical zero data signal A, the output signal from NOR gate 32 is a logical one, thus causing N channel MOS transistor 39 to turn on. With transistor 36 off and transistor 39 on, output terminal 38 is effectively disconnected from the positive supply voltage VCC applied to terminal 37 and is connected to ground. Thus, with buffer 30 enabled by a high enable signal E and with a logical zero data signal A, output terminal 38 is low and is capable of sinking current from external circuitry (not shown) connected to output terminal 38. Conversely, with a logical one enable signal E and a logical one data signal A applied to Tri-State buffer 30, the output signal from NAND gate 31 is a logical zero, thus causing P channel transistor 36 to turn on. Similarly, with a logical one enable signal E and a logical one data signal A, the output signal from NOR gate 32 is a logical zero, thus causing N channel MOS transistor 39 to turn off. With transistor 36 on and transistor 39 off, output terminal 38 is effectively connected to the positive supply voltage VCC applied to terminal 37 and is disconnected from ground. Thus, with buffer 30 enabled by a high enable signal E and with a logical one data signal A, output terminal 38 is high and is capable of sourcing current to external circuitry (not shown) connected to output terminal 38.

The truth table for active high Tri-State circuit 30 of FIG. 3 is as follows:

| E | A | Z |
|---|---|---|
| 0 | 0 | High impedance |
| 0 | 1 | High impedance |
| 1 | 0 | 0 |
| 1 | 1 | 1 |

When MOS transistors of typical dimensions are used to construct buffer 30, Tri-State buffer 30 is incapable of providing as much driving (i.e. source or sink) current to terminal 38 as Tri-State buffer 20 of FIG. 2 because buffer 30 does not include buffers between gates 31 and 32 and output transistors 36 and 39, respectively. Thus, gates 31 and 32 are incapable of providing as much drive current to output transistors 36 and 39 as compared to a circuit which includes buffers of high driving current capabilities connected between gates 31 and 32 and output transistors 36 and 39, respectively. Accordingly, output transistors 36 and 39 of buffer 30 are typically made of smaller size than the output transistors 28a and 28b of the buffer 20 of FIG. 2. Furthermore, with Tri-State buffer 30 enabled, the data signal A is capable of controlling the output signal Z after only two gate delays (i.e. the gate delays provided by gate 31 and transistor 36 and the gate delay provided by gate 32 and transistor 39). Accordingly, the Tri-State buffer 30 of FIG. 3 is typically faster than the Tri-State buffer 20 of FIG. 2, although the Tri-State buffer 20 of FIG. 2 is capable of sourcing and sinking greater amounts of current than is the Tri-State buffer 30 of FIG. 3. The Tri-State buffer 30 of FIG. 3 requires a total of twelve MOS transistors.

SUMMARY

In accordance with the teachings of this invention, a Tri-State circuit is constructed which is uniquely suited for use in large scale integrated circuit devices wherein a relatively large number of such Tri-State circuits are utilized to drive other circuitry contained within the integrated circuit device. In accordance with the teachings of this invention, one embodiment of a Tri-State circuit is constructed utilizing a single NAND gate, single inverter, and, in addition, a single P channel transistor, and two N channel transistors. The circuit so constructed has a propagation delay of only two gate delays and requires a total of only nine transistors. Furthermore, because this embodiment utilizes two series-connected N channel transistors connected in series with a single P channel transistor, the circuit is capable of sourcing and sinking the same amount of current when the P channel and N channel transistors are constructed of the same dimensions, and the turn off time of the two N channel transistors connected in series is substantially equal to the turn off time of the single P channel transistor, thus resulting in a circuit which is capable of disconnecting its output lead from the positive supply voltage in substantially the same amount of time required to disconnect its output lead from ground, thus providing symmetrical turn off time.

In another embodiment of my invention, an active low Tri-State buffer is constructed utilizing a single NOR gate, a single inverter, a single N channel transistor, and two P channel transistors. In this embodiment of my invention, a total of nine MOS transistors are required, and the propagation delay between the input terminal and the output terminal is equal to two gate delays.

DETAILED DESCRIPTION

Figure 7:
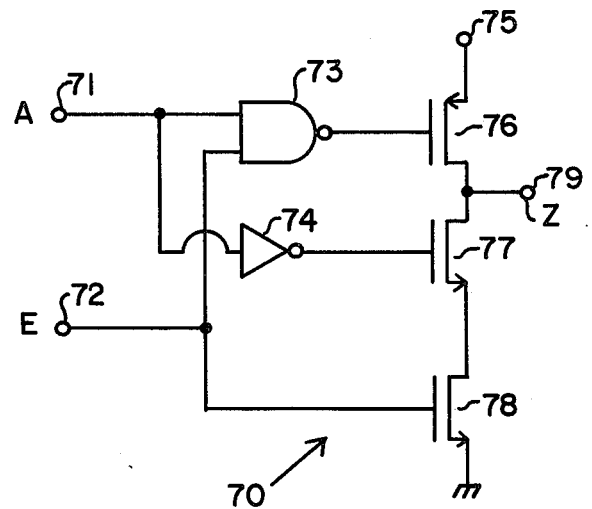
FIG. 7 is a schematic diagram of one embodiment of an active high Tri-State buffer circuit constructed in accordance with the principles of this invention.

One embodiment of an active high Tri-State buffer 70 constructed in accordance with the principles of this invention is shown in a schematic diagram of FIG. 7. With a low enable signal E applied to terminal 72, NAND gate 73 provides a logical high signal on its output lead which is connected to the gate of P channel MOS transistor 76, thus causing transistor 76 to turn off. Simultaneously, the low enable signal E is applied to the gate of N channel MOS transistor 78, thus causing transistor 78 to turn off. With transistors 76 and 78 turned off, the output terminal 79 is effectively disconnected from the positive supply voltage applied to terminal 75 and is also effectively disconnected from ground, thus causing output terminals 79 to be in the high impedance state ("float")

Conversely, with a high enable signal E applied to input terminal 72, N channel transistor 78 is turned on. Simultaneously, this high enable signal E is applied to one input lead of NAND gate 73, thus causing the output signal from NAND gate 73 to be determined by the logical state of the input data signal A applied to terminal 71. For example, with a low data input signal A applied to terminal 71, the output signal from NAND gate 73 will be high, thus causing P channel transistor 76 to turn off. Simultaneously, inverter 74 provides a high output signal to the gate of N channel MOS transistor 77, thus causing transistor 77 to turn on. With transistor 76 turned off and transistor 77 and 78 turned on, output terminal 79 is effectively disconnected from the positive voltage supply VCC connected to terminal 75 and is effectively connected to ground, thus providing a low output signal Z thereby allowing Tri-State buffer circuit 72 to sink current from external circuitry (not shown) connected to terminal 79.

On the other hand, with Tri-State buffer 70 enabled by a high enable signal E and a high data input signal A applied to terminal 71, NAND gate 73 provides a low output signal connected to the gate of transistor 76, thus causing transistor 76 to turn on. Simultaneously, inverter 74 provides a low output signal connected to the gate of transistor 77, thus causing transistor 77 to turn off. With transistor 76 on and transistor 77 off, output terminal 79 is effectively connected to the positive voltage supply VCC connected to terminal 75 and is effectively disconnected from ground. Thus, the output signal Z on terminal 79 is high, thus allowing Tri-State buffer circuit 70 to source current to external circuitry (not shown) connected to terminal 79.

The truth table for Tri-State buffer 70 is as follows:

| E | A | Z |
|---|---|---|
| 0 | 0 | High impedance |
| 0 | 1 | High impedance |
| 1 | 0 | 0 |
| 1 | 1 | 1 |

Figures 1A, 1B:
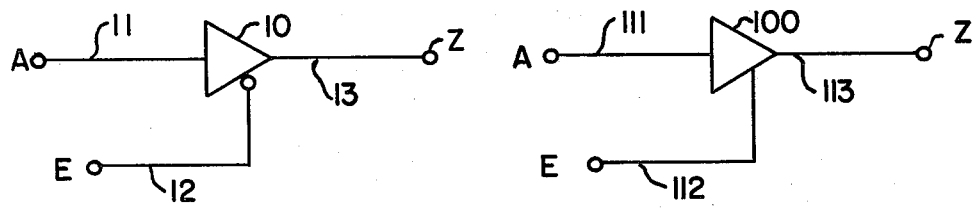
FIGS. 1a and 1b show the symbols for an active low and an active high Tri-State buffer, respectively.
Figure 3:
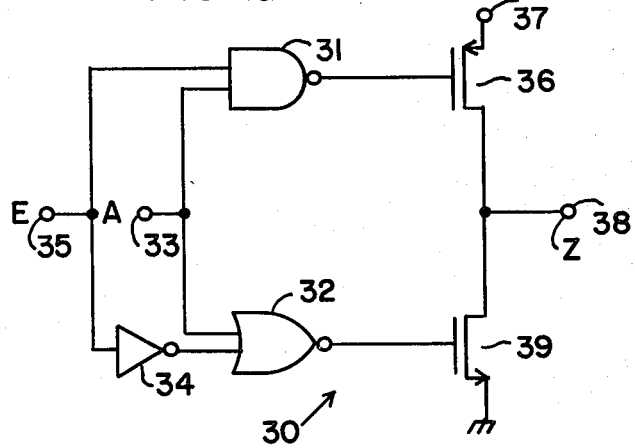
FIG. 3 is a schematic diagram of another prior art Tri-State buffer.
Figure 2:
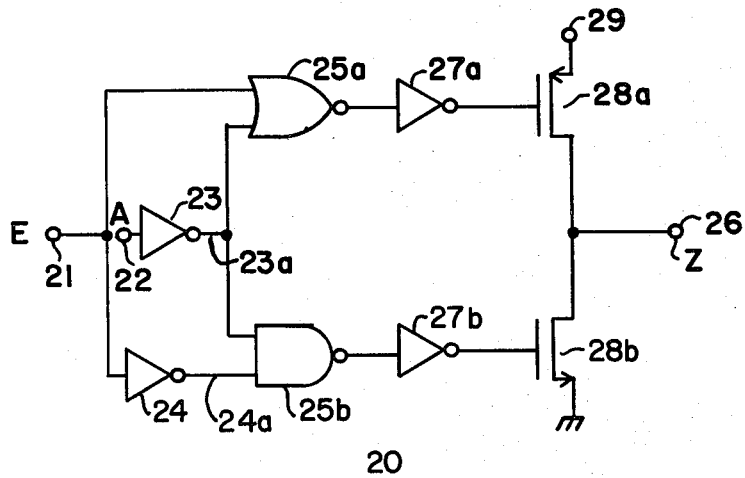
FIG. 2 is a schematic diagram of one prior art Tri-State buffer.
Figure 4A:
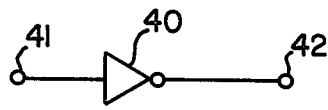
FIGS. 4a and 4b show, respectively, the symbol of an inverter and its schematic diagram when implemented utilizing MOS transistors.
Figure 4B:
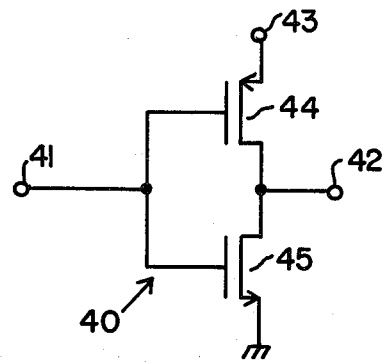
Figure 5A:
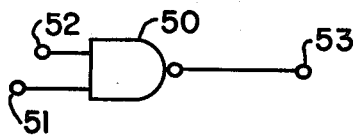
FIGS. 5a and 5b show, respectively, the symbol for a NAND gate and its schematic diagram utilizing MOS transistors.
Figure 6A:
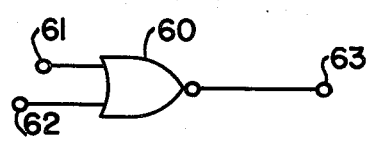
FIGS. 6a and 6b show, respectively, the symbol for a NOR gate and its schematic diagram utilizing MOS transistors.
Figure 5B:
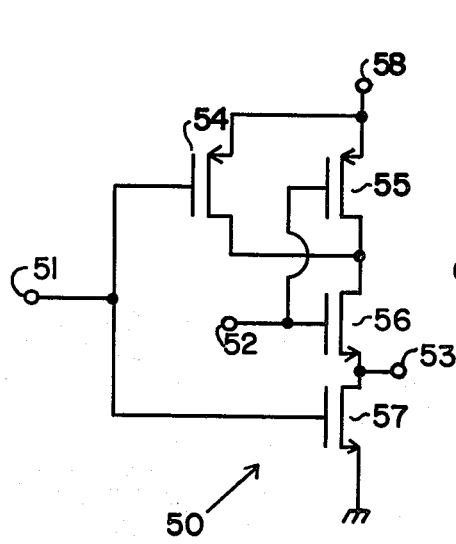
Figure 6B:
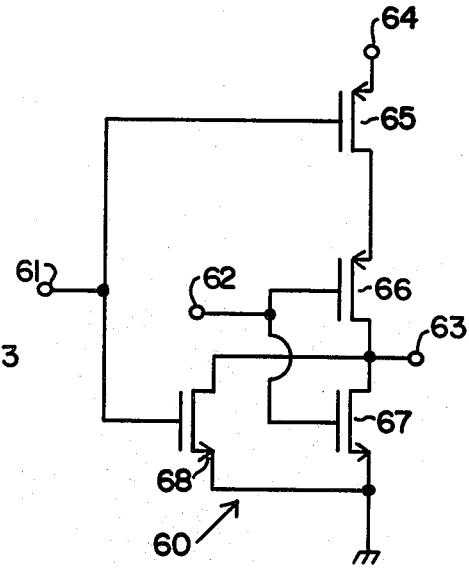

As previously described, a NAND gate requires four MOS transistors in its construction, and an inverter requires two MOS transistors in its construction. Accordingly, the active high Tri-State buffer 70 of FIG. 7 requires a total of nine MOS transistors in its construction. Furthermore, the delay between the receipt of a data input signal A, when Tri-State buffer 70 is enabled, and the generation of a corresponding output signal Z on terminal 79, is equal to two gate delays (i.e., the gate delays provided by NAND gate 73 and transistor 76, and the gate delays provided by inverter 74 and transistor 77). Furthermore, because the embodiment of this invention shown in the schematic diagram of FIG. 7 utilizes two N channel MOS transistors 77 and 78 connected in series with a single P channel MOS transistor 76, when transistors 76, 77 and 78 are constructed of similar dimensions, Tri-State buffer 70 is capable of sourcing through P channel transistor 76 an amount of current substantially equal to the amount of current which Tri-State buffer 70 is capable of sinking through N channel transistors 77 and 78. Thus, because it is quite convenient to design both P channel and N channel MOS transistors having the same physical dimensions, the Tri-State buffer 70 will be substantially symmetrical in its ability to sink current on the one hand, and its ability to source current on the other hand. Furthermore, because the turn off time of a P channel transistor is about twice as long as the turn off time of an N channel transistor of equal size (due to the greater mobility of electrons than holes), the use of two N channel transistors 77 and 78 provides a turn off time of N channel transistor 77 which is approximately equal to the turn off time of P channel transistor 76 Accordingly, the speed of operation of the embodiment of my invention as shown in FIG. 7 is substantially improved over the speed of operation of the prior art circuit of FIG. 2. Furthermore, the number of components required to construct the embodiment of my invention shown in FIG. 7 is substantially reduced over the number of components required to construct either the prior art Tri-State buffer of FIG. 2 or that of FIG. 3.

Figure 8:
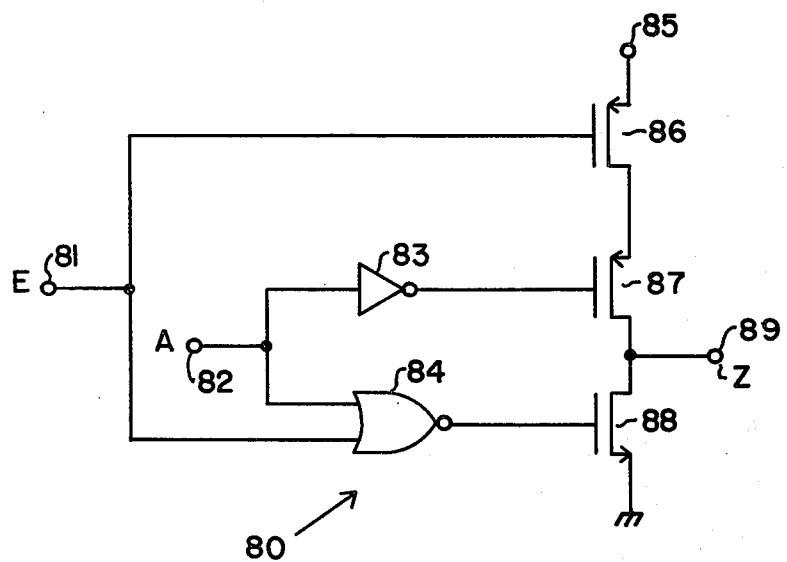
FIG. 8 is a schematic diagram of one embodiment of an active low Tri-State buffer constructed in accordance with the principals of this invention.

One embodiment of an active low Tri-State buffer circuit 80 constructed in accordance with the principles of this invention is shown in the schematic diagram of FIG. 8. With a high enable signal E applied to input terminal 81, the gate of P channel transistor 86 is high, thus causing transistor 86 to turn off. Similarly, with a high enable signal E applied to one input lead of NOR gate 84, the output signal from NOR gate 84 is low. This low output signal in turn is applied to the gate of N channel transistor 88, thus causing transistor 88 to turn off. With transistors 86 and 88 turned off, output terminal 89 is effectively disconnected from the positive supply voltage VCC applied to terminal 85, and is also effectively disconnected from ground, thus causing output terminal 89 to "float" or be in the high impedance state, thereby preventing terminal 89 from sourcing current to or sinking current from external circuitry (not shown) connected to terminal 89.

Conversely, with a low enable signal E applied to input terminal 81, the gate of P channel transistor 86 is low, thus causing transistor 86 to turn on. Similarly, the low enable signal E is applied to one input lead of NOR gate 84, thus causing the output signal from NOR gate 84 to be dependent on the input data signal A applied to the other input lead of NOR gate 84. Thus, with a low input data signal A applied to terminal 82, the output signal from NOR gate 84 will be high, thus causing transistor 88 to turn on. Simultaneously, the output signal from inverter 83 is high, thus causing transistor 87 to turn off. With transistor 87 off and transistor 88 on, output terminal 89 is effectively disconnected from the positive supply voltage VCC connected to terminal 85, and is effectively connected to ground, thus providing a low output signal Z, thus enabling Tri-State buffer 80 to sink current from external circuitry (not shown) connected to terminal 89. On the other hand, with a high data input signal A applied to terminal 82, the output signal from NOR gate 84 is low, thus causing transistor 88 to turn off. Simultaneously, the output signal from inverter 83 is low, thus causing transistor 87 to turn on. With transistor 87 on and transistor 88 off, and transistor 86 on as previously described, output terminal 89 is effectively connected to the positive supply voltage VCC connected to terminal 85 and is effectively disconnected from ground, thus providing a high output signal Z on terminal 89 and thus allowing Tri-State buffer 80 to source current to external circuitry (not shown) connected to terminal 89.

The truth table for Tri-State buffer 80 is as follows:

| E | A | Z |
|---|---|---|
| 0 | 0 | 0 |
| 0 | 1 | 1 |
| 1 | 0 | High impedance |
| 1 | 1 | High impedance |

Because a NOR gate requires four MOS transistors in its construction and an inverter requires two MOS transistors in its construction, the embodiment of my invention depicted in FIG. 8 requires a total of only nine MOS transistors. Furthermore, the propagation delay between receipt of a data input signal A and the generation of a corresponding output signal Z in response thereto is only two gate delays (i.e., the gate delays provided by inverter 83 and transistor 87, and the gate delays provided by NOR gate 84 and transistor 88). Accordingly, the speed of operation of the embodiment of my invention as shown in FIG. 8 is substantially improved over the speed of operation of the prior art circuit of FIG. 2. Furthermore, the number of components required to construct the embodiment of my invention shown in FIG. 8 is substantially reduced over the number of components required to construct either the prior art Tri-State buffer of FIG. 2 or that of FIG. 3.

While specific embodiments of my invention have been described in this specification, it is to be understood that these embodiments serve by way of example only and are not to be construed as limitations on the scope of my invention. Numerous other embodiments of my invention will become apparent to those of ordinary skill in the art in light of the teachings of this disclosure.

I claim:

1. A Tri-State buffer having a data signal input terminal for receiving a data signal, an enable signal input terminal for receiving an enable signal, and an output signal terminal for providing an output signal, comprising:
    a first MOS transistor of a first conductivity type having a source, a drain, and a gate, said source being connected to a first supply voltage, and said drain being connected to said output signal terminal;
    a second MOS transistor of a second conductivity type opposite said first conductivity type, said second MOS transistor having a drain connected to said output signal terminal, a source, and a gate;
    a third MOS transistor of said second conductivity type having a drain connected to said source of said second MOS transistor, a source connected to a second supply voltage, and a gate connected to said enable input signal terminal;
    a NAND gate having a first input lead connected to said data signal input terminal, a second input lead connected to said enable signal input terminal, and an output lead connected to said gate of said first MOS transistor; and
    an inverter having an input lead connected to said data signal input terminal and an output lead connected to said gate of said second MOS transistor.

2. The structure as in claim 1 wherein said first conductivity type is P, said second conductivity type is N, and said first supply voltage is more positive than said second supply voltage.

3. The structure as in claim 2 wherein said output signal terminal is disabled in the high impedance state such that said output signal terminal is disconnected from said first and said second supply voltages, in response to a low enable signal.

4. The structure as in claim 2 wherein said output signal terminal is enabled by a high enable signal applied to said enable input signal terminal.

5. The structure as in claim 4 wherein, in response to a high enable signal and a high data signal, said output signal is high and said output signal terminal is capable of sourcing current.

6. The structure as in claim 4 wherein, in response to a high enable signal and a low data signal, said output signal is low and said output signal terminal is capable of sinking current.

7. A Tri-State buffer having a data signal input terminal for receiving a data signal, an enable signal input terminal for receiving an enable signal, and an output signal terminal for providing an output signal, comprising:
    a first MOS transistor of a first conductivity type having a source, a drain, and a gate, said source being connected to a first supply voltage, and said drain being connected to said output signal terminal;
    a second MOS transistor of a second conductivity type opposite said first conductivity type, said second MOS transistor having a drain connected to said output signal terminal, a source, and a gate;
    a third MOS transistor of said second conductivity type having a drain connected to said source of said second MOS transistor, a source connected to a second supply voltage, and a gate connected to said enable input signal terminal;
    a NOR gate having a first input lead connected to said data signal input terminal, a second input lead connected to said enable signal input terminal, and an output lead connected to said gate of said first MOS transistor; and
    an inverter having an input lead connected to said data signal input terminal and an output lead connected to said gate of said second MOS transistor.

8. The structure as in claim 7 wherein said first conductivity type is N, said second conductivity type is P, and said second supply voltage is more positive than said first supply voltage.

9. The structure as in claim 8 wherein said output signal terminal is disabled in the high impedance state such that said output signal terminal is disconnected from said first and said second supply voltages, in response to a high enable signal.

10. The structure as in claim 8 wherein said output signal terminal is enabled by a low enable signal applied to said enable input signal terminal.

11. The structure as in claim 10 wherein, in response to a low enable signal and a high data signal, said output signal is high and said output signal terminal is capable of sourcing current.

12. The structure as in claim 10 wherein, in response to a low enable signal and a low data signal, said output signal is low and said output signal terminal is capable of sinking current.

* * * * *